(12) United States Patent
Zhang et al.

(10) Patent No.: US 10,256,843 B2
(45) Date of Patent: Apr. 9, 2019

(54) SYSTEMS, METHODS, AND DEVICES FOR ENCODING AND DECODING DATA USING MULTI-LAYER INTEGRATED INTERLEAVED CODES

(71) Applicant: Western Digital Technologies, Inc., San Jose, CA (US)

(72) Inventors: Xinmiao Zhang, Mercer Island, WA (US); Martin A. Hassner, Mountain View, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 50 days.

(21) Appl. No.: 15/671,141

(22) Filed: Aug. 7, 2017

(65) Prior Publication Data
US 2018/0358987 A1 Dec. 13, 2018

Related U.S. Application Data

(60) Provisional application No. 62/517,812, filed on Jun. 9, 2017.

(51) Int. Cl.
*H03M 13/29* (2006.01)
*H03M 13/37* (2006.01)
(Continued)

(52) U.S. Cl.
CPC ... *H03M 13/2927* (2013.01); *H03M 13/2924* (2013.01); *H03M 13/3761* (2013.01); *G06F 17/16* (2013.01); *G06F 17/175* (2013.01)

(58) Field of Classification Search
CPC ............ H03M 13/09; H03M 13/2903; H03M 13/2906; H03M 13/2924; H03M 13/2927; H03M 13/2761
See application file for complete search history.

(56) References Cited

U.S. PATENT DOCUMENTS

| 8,161,360 B1* | 4/2012 | Wu ................. | H03M 13/2903 714/767 |
|---|---|---|---|
| 2013/0246887 A1* | 9/2013 | Torii ..................... | H03M 13/09 714/758 |
| 2017/0214415 A1* | 7/2017 | Kokubun .......... | H03M 13/2906 |

OTHER PUBLICATIONS

Wu, Generalized integrated interleaved codes, IEEE, pp. 1102-1119, Feb. 2017 (Year: 2017).*

(Continued)

*Primary Examiner* — Shelly A Chase
(74) *Attorney, Agent, or Firm* — Kunzler, PC

(57) ABSTRACT

A data storage system stores a set of codewords in memory. The set of codewords are encoded in accordance with a joint nesting matrix specifying multiple layers of integrated interleaved codes, including first, second and third layers of integrated interleaved codes, and the set of codewords stored in the memory include first, second and third layers of parity information corresponding to the first, second and third layers of integrated interleaved codes. When decoding a first codeword and a first subgroup containing the first codeword fail, the system decodes a group of codewords that include two more subgroups of codewords, including the first subgroup of codewords, using the third layer parity information for the group of codewords. The second and third layers of integrated interleaved codes are configured to enable decoding of two codewords, in a subgroup of codewords, having errors beyond the correction capability of the first layer codes.

20 Claims, 5 Drawing Sheets

(51) Int. Cl.
G06F 17/16 (2006.01)
G06F 17/17 (2006.01)

(56) References Cited

OTHER PUBLICATIONS

Cassuto et al., Multi block interleaved codes for local and global read access, (Google.com), pp. 1 to 6, Jan. 2017 (Year: 2017).*
Tang et al, A novel method for combining algebraic decoding and iterative processing, IEEE, pp. 474-478 (Year: 2006).*

* cited by examiner

Joint Nesting Matrix 232
First (Upper) Portion 402

$$\Gamma = \begin{bmatrix} G_1 & 0 & \cdots & 0 \\ 0 & G_1 & \cdots & 0 \\ \vdots & \vdots & \ddots & \vdots \\ 0 & 0 & \cdots & G_1 \\ \hline & & G_2 & \end{bmatrix} = \begin{bmatrix} G_1 & 0 & \cdots & 0 \\ 0 & G_1 & \cdots & 0 \\ \vdots & \vdots & \ddots & \vdots \\ 0 & 0 & \cdots & G_1 \\ \hline G_2^{r-1} & G_2^{r-1} & \cdots & G_2^{r-1} \\ G_2^{r-2} & \alpha^{-1} G_2^{r-2} & \cdots & \alpha^{-(m_1-1)} G_2^{r-2} \\ \vdots & \vdots & \ddots & \vdots \\ G_2^0 & \alpha^{-(r-1)} G_2^0 & \cdots & \alpha^{-(m_1-1)(r-1)} G_2^0 \end{bmatrix}$$

404
Second (Lower) Portion

Figure 4A $$G_1 = \begin{bmatrix} 1 & 1 & 1 & \cdots & 1 \\ 1 & \alpha & \alpha^2 & \cdots & \alpha^{m_2-1} \\ \vdots & \vdots & \vdots & \ddots & \vdots \\ 1 & \alpha^{(v-1)} & \alpha^{2(v-1)} & \cdots & \alpha^{(v-1)(m_2-1)} \end{bmatrix}$$

Figure 4B $$G_2^i = \begin{bmatrix} 1 & \alpha^{v_1} & \alpha^{2v_1} & \cdots & \alpha^{v_1(m_2-1)} \\ 1 & \alpha^{v_1+1} & \alpha^{2(v_1+1)} & \cdots & \alpha^{(v_1+1)(m_2-1)} \\ \vdots & \vdots & \vdots & \ddots & \vdots \\ 1 & \alpha^{v_1+s_i-1} & \alpha^{2(v_1+s_i-1)} & \cdots & \alpha^{(v_1+s_i-1)(m_2-1)} \end{bmatrix}$$

Figure 4C $$\Gamma_{GII} = \begin{bmatrix} 1 & 1 & 0 & 0 \\ 0 & 0 & 1 & 1 \\ 1 & \alpha & 1 & \alpha \end{bmatrix}$$

Figure 4D

SYSTEMS, METHODS, AND DEVICES FOR ENCODING AND DECODING DATA USING MULTI-LAYER INTEGRATED INTERLEAVED CODES

CROSS-REFERENCES TO RELATED APPLICATIONS

This application claims the benefit of U.S. Provisional Patent Application No. 62/517,812 entitled "Systems, Methods, and Devices for Encoding and Decoding Data Using Multi-Layer Integrated Interleaved Codes" and filed on Jun. 9, 2017 for Xinmiao Zhang, et al., which is incorporated herein by reference.

TECHNICAL FIELD

The present disclosure relates to using error control codes in memory systems, and in particular, to using generalized three-layer integrated interleaved codes to encode data to be stored in a memory system and to decode data to be read from the memory system.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater storage density, so that specifications such as power consumption and form factor may be maintained and preferably reduced. As such, there is ongoing pressure to increase the storage density of non-volatile memories in order to further improve the useful attributes of such devices. However, a drawback of increasing storage density is that the stored data is increasingly prone to storage and/or reading errors.

Error control coding has been used to limit the increased likelihood of errors in memory systems. The term codeword is used herein to mean a "word" of data (for example, without limitation, 4 KB of data) that is structured according to error or erasure correcting codes. It has parity information that can be utilized to correct errors or erasures.

Error-correcting codes are adopted in numerous digital storage and communication systems. In some memory systems in which the error numbers in different codewords are unbalanced, such as due to fabrication process variations, it is more efficient to have fewer parities in each codeword and adopt global parities sharable by a group of codewords to correct extra errors. Additionally, the parities for individual codewords can be used for local failure recovery, which is essential to enable continued scaling of high-performance distributed storage. Erasures are errors whose locations are known. When the number of errors and/or erasures does not exceed the correction capability of individual codewords, they are correctable by accessing individual words instead of all the words in the group of codewords.

In integrated interleaved (II) codes, a set of linear block codewords, which are also called interleaves, are nested to create codewords of a stronger linear block code that is a subcode of the base linear block code. Hence, unlike other codes with shared parities, the integrated interleaved codes do not need another code to protect the shared parities. Using so-called generalized integrated interleaved (GII) codes, different codewords in a group of codewords can be given different correction capability.

Sharable parities are defined using parity check matrices in generalized concatenated (GC) codes. Since the encoding and decoding are both done by solving linear equations, they have higher implementation complexity than GII codes when the error correction capability is not small.

The aforementioned II and GII codes are two-layer codes. The first layer is the base code, having a certain error-correction capability, and the second layer consists of codes, which have higher error-correction capability than the first layer, generated by nesting all the codewords in a group of codewords. In systems that implement II and GII two-layer codes, if a codeword in a group has "extra" errors (i.e., more errors than the error correction capability of the first layer codes), all codewords in the group must be accessed and decoded in order to utilize the shared parity, shared by all codewords in the group, and thus the cost of correcting such extra errors is substantial, in terms of both resources used and latency incurred. Therefore new codes with encoding and decoding methods are needed to improve locality, and decrease the average cost of correcting extra errors in codewords.

SUMMARY

Various implementations of systems, methods and devices within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to enable encoding and decoding of data using three-layer generalized integrated interleaved codes that improve locality and enable correction of errors in multiple codewords, or errors in multiple subgroups of codewords, that were not correctable using the first layer and second later of integrated interleaved codes, using a third layer of integrated interleaved codes.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 4A is a generalized diagram of a joint nesting matrix, in accordance with some embodiments.

FIGS. 4B and 4C are diagrams of $G_1$ and $G_2$ generator matrices, which are components of the joint nesting matrix of FIG. 4A, in accordance with some embodiments.

FIG. 4D is a specific example of the joint nesting matrix of FIG. 4A, in accordance with some embodiments.

Figure 1:
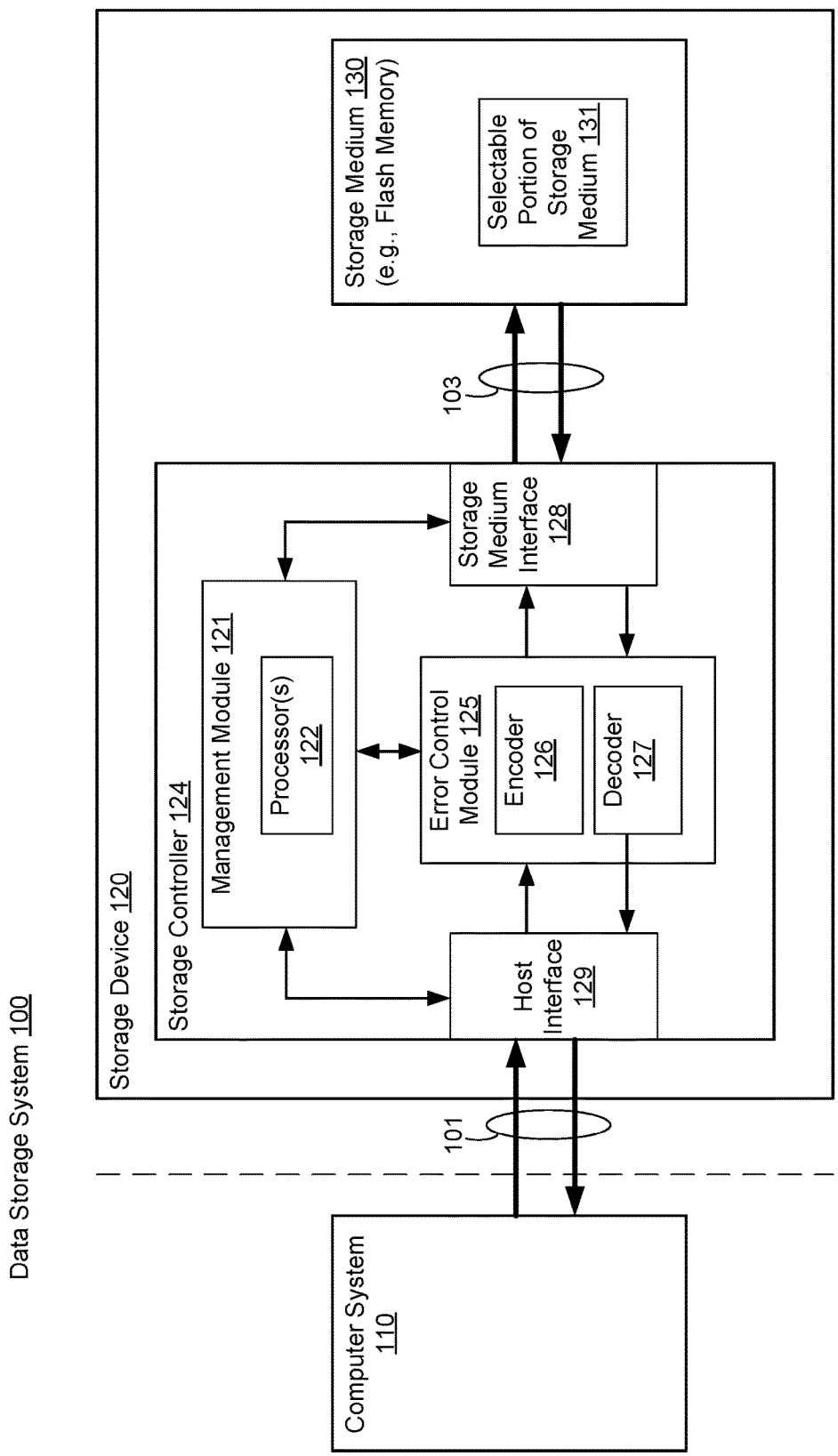
FIG. 1 is a schematic diagram of a data storage environment, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

The various implementations described herein include systems, methods and/or devices that may enhance the performance of error control codes used to improve the reliability with which data can be stored and read in a storage medium, such as a flash memory.

Continuing the discussion started in the Background section of this document, to achieve better locality, which is defined as the number of symbols that need to be accessed to enable error correction, a special class of the integrated interleaved coding scheme with multiple layers may be used, as discussed in more detail below. Parities are added to subgroups of codewords in a hierarchical manner. It is noted that in prior integrated interleaved coding schemes that have more than two layers, a shared parity for a group of codewords only provides extra protection for one of the codewords in one of the subgroups of codewords it covers in the next lower layer. In the embodiments described below, generalized integrated interleaved (GII) codes are constructed so that the second and third layers of codes provides extra protection for two or more codewords in a subgroup, and/or provides extra protection to two or more subgroups of codewords.

(A1) In some embodiments, a method of operating a data storage system includes storing a set of codewords in memory located within the data storage system, wherein the set of codewords are encoded in accordance with a joint nesting matrix specifying multiple layers of integrated interleaved codes, including first, second and third layers of integrated interleaved codes, and the set of codewords stored in the memory include first, second and third layers of parity information corresponding to the first, second and third layers of integrated interleaved codes. The method further includes receiving a first data read command specifying data to be read from the memory, and in response to the first data read command, performing a sequence of operations, including: initiating decoding of the first codeword using the first layer parity information for the first codeword, and in accordance with a determination that the decoding of the first codeword using the first layer of parity information is unsuccessful, initiating decoding of a first subgroup of codewords that include the first codeword using the second layer parity information for the first subgroup of codewords.

The method further includes, in accordance with a determination that the decoding of the first subgroup of codewords using the second layer of parity information for the first subgroup is unsuccessful, initiating decoding of a group of codewords that include a plurality of subgroups of codewords, including the first subgroup of codewords, using the third layer parity information for the group of codewords, including: identifying, in the group of codewords, one or more subgroups of codewords in the group of codewords that include at least one codeword not correctable using the first layer parity information for the at least one codeword and the second layer parity information for the identified subgroups of codewords. After identifying the one or more subgroups, the method includes forming a syndrome transformation matrix, comprising an invertible submatrix of the joint nesting matrix, corresponding to the identified one or more subgroups of codewords; inverting the syndrome transformation matrix; generating a set of derived codeword syndromes by multiplying nested syndromes corresponding to the identified one or more subgroups of codewords by the inverted syndrome transform matrix; and decoding one or more codewords, including the first codeword, using the derived codeword syndromes.

(A2) In some embodiments of the method of A1, the first subgroup includes at least two codewords not correctable using the first layer parity information for the at least two codewords.

(A3) In some embodiments of the method of A1, the first layer of integrated interleaved codes are for correcting errors in individual codewords in the set of codewords, the second layer of integrated interleaved codes are for correcting errors in subgroups of codewords in the set of codewords that are not correctable by the first layer of integrated interleaved codes, each subgroup of codewords having $m_2$ codewords, and the third layer of integrated interleaved codes are for correcting errors in subgroups of the codewords having at least one codeword not correctable using the first and second layers of integrated interleaved codes, each group having $m_1$ subgroups, where $m_1$ is an integer greater than 1 and $m_2$ is an integer greater than 1. Furthermore, in such embodiments, the joint nesting matrix has $m_1$ column blocks, comprising blocks of columns, each column block having $m_2$ columns, and furthermore having a first portion that has a first set of rows and a second portion that has a second set of rows. The first portion has non-zero elements only along a main diagonal of the joint nesting matrix, each non-zero element of the main diagonal comprising a first nesting matrix, $G_1$, having $v_1$ rows and $m_2$ columns, where $v_1$ is a number of levels of integrated interleaved codes in the second layer of integrated interleaved codes; and the second portion has r−1 row blocks, comprising blocks of rows, and $m_1$ column blocks, where r is a maximum number of subgroups having errors not correctable by the second layer of integrated interleaved codes that can be corrected using the third layer of integrated interleaved codes, each element of the second portion comprising a submatrix, corresponding to one row block and one column block of the second portion, having $m_2$ columns and $s_i$ rows, where $s_i$ is a maximum number of codewords, in subgroup i of the $m_1$ subgroups, having errors not correctable by the second layer of integrated interleaved codes for subgroup i that can be corrected using the third layer of integrated interleaved codes.

(A4) In some embodiments of the method of A3, r is equal to one or more.

(A5) (A4) In some embodiments of the method of A4, $s_i$, for at least one subgroup i of the $m_1$ subgroups, is equal to one or more.

(A6) In some embodiments of the method of A3, each submatrix in the second portion of the joint nesting matrix is of the form $\alpha^j G_2^i$ where i ranges from r−1 to 0 and corresponds to the row block of the second portion in which the submatrix is located, j ranges from 0 to 1−r and corresponds to the column block in which the submatrix is located, and $G_2^i$ comprises a nesting matrix of the form shown in FIG. 4C, having $m_2$ columns and $s_i$ rows.

(A7) In some embodiments of the method of any of A1-A6, the memory storing the set of codewords comprises one or more flash memory devices.

(A8) In some embodiments of the method of any of A1-A7, the set of codewords includes N codewords, stored in N distinct memory devices, where N is an integer having a value of 4 or more.

(A9) In some embodiments, a data storage system is configured to operate in accordance with the method of any of A1 to A8.

(A10) In some embodiments, a computer readable storage medium includes one or more programs, for execution by one or more processors of a data storage system controller, to cause the data storage system to perform the method of any of A1 to A8.

Numerous details are described herein in order to provide a thorough understanding of the example implementations illustrated in the accompanying drawings. However, the invention may be practiced without many of the specific details. And, well-known methods, components, and circuits have not been described in exhaustive detail so as not to unnecessarily obscure more pertinent aspects of the implementations described herein.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a diagram of an implementation of a data storage environment, namely data storage environment 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, data storage environment 100 includes data processing system 110, and storage device 120.

Data processing system 110 is coupled to storage device 120 through data connections 101. Those skilled in the art will appreciate from the present disclosure that in various implementations data processing system 110 includes storage device 120 as a component. Generally, data processing system 110 includes any suitable computer device, such as a computer, a laptop computer, a tablet device, a netbook, an internet kiosk, a personal digital assistant, a mobile phone, a smart phone, a gaming device, a computer server, or any other computing device. In some implementations, data processing system 110 includes one or more processors, one or more types of memory, a display and/or other user interface components such as a keyboard, a touch screen display, a mouse, a track-pad, a digital camera and/or any number of supplemental devices to add functionality.

Storage device 120 includes a storage medium 130 coupled to storage controller 120 through data connections 103. Those skilled in the art will appreciate from the present disclosure that in various implementations storage controller 120 and storage medium 130 are included in the same device (e.g., storage device 120) as constituent components thereof, while in other embodiments storage controller 120 and storage medium 130 are, or are in, separate devices. Storage medium 130 includes any number (i.e., one or more) of memory devices including, without limitation, non-volatile semiconductor memory devices, such as flash memory. For example, flash memory devices can be configured for enterprise storage suitable for applications such as cloud computing. Additionally, and/or alternatively, flash memory devices can also be configured for relatively smaller-scale applications such as personal flash drives or hard-disk replacements for personal, laptop and tablet computers. In some implementations, storage medium 130 comprises one or more flash memory devices. In some implementations, storage medium 130 comprises at least one of NAND-type flash memory and NOR-type flash memory.

Storage mediums are often divided into a number of addressable and individually selectable blocks, such as selectable portion 131. In some implementations, for flash memory, the individually selectable blocks are the minimum erasable units in a flash memory device. In other words, each block contains a minimum number of memory cells that can be erased simultaneously. Each block is usually further divided into a plurality of pages, where each page is typically an instance of a minimum unit of the smallest individually accessible sub-block in the block. However, in some implementations (e.g., in some types of flash memory), the minimum unit of individually accessible data is a sector, which is a subset of a page. That is, each page contains a plurality of sectors and each sector is the minimum unit of individually accessible data for writing data to or reading data from the flash memory device.

For the sake of notation only, a block of data includes a plurality of pages, typically a fixed number of pages per block, and each page includes a plurality of sectors, typically a fixed number of sectors per page. For example, in some implementations, one block includes 64 pages, 128 pages, 256 pages, or another suitable number of pages. The respective sizes of blocks, pages and sectors are often a matter of design choice or end-user choice, and are often differ across a wide range of enterprise and consumer devices. However, for example only, and without limitation, in some enterprise applications a page includes 2K (i.e., 2048) to 16K bytes, and a sector includes anywhere from 256 bytes to 544 bytes. Those range may be extended upward or downward, and/or shrink or expand depending on a particular application. In some embodiments, each page stores one or more codewords, where a codeword is the smallest unit of data that is separately encoded and decoded by the encode and decoder mechanisms of a particular device.

In some implementations, memory controller 120 includes management module 121, error control module 125, storage medium interface (I/O) 128 and host interface 129. Host interface 129 couples storage device 120 and its storage controller 124 to one or more computer systems 110, while storage medium interface 128 coupled storage controller 124 to storage medium 130. Those skilled in the art will appreciate from the present disclosure that storage controller 120 includes various additional features that have not been illustrated for the sake of brevity, and so as not to obscure more pertinent features of the example implementations disclosed herein, and that a different arrangement of features may be possible.

Host interface typically includes data buffers (not shown) to buffer data being received and transmitted by storage device 120, via data connections 101. Similarly, storage medium I/O 128 provides an interface to storage medium 130 though data connections 103. In some implementations, storage medium interface 128 includes read and write circuitry.

In some implementations, management module 121 includes one or more processors 122. However, those skilled in the art will appreciate from the present disclosure that, in some implementations, processor 122 is shared by one or more components within, and in some cases, beyond the function of storage controller 120. Management module 121 is coupled to host interface 129, error control module 125 and storage medium I/O 128 in order to coordinate the operation of these components.

Error control module 125 is coupled between storage medium I/O 128 and host interface 129. In some implementations, error control module 125 is provided to limit the number of uncorrectable errors inadvertently introduced into data. To that end, error control module 125 includes encoder 126 and decoder 127. Encoder 126 encodes data to produce a codeword which is subsequently stored in storage medium 130. When the encoded data is read from storage medium 130, decoder 127 applies a decoding process to recover the data, and correct errors within the error correcting capability of the error control code. Those skilled in the art will appreciate from the present disclosure that various error control codes have different error detection and correction capacities, and that particular codes are selected for various applications for reasons beyond the scope of this disclosure.

Figure 2:
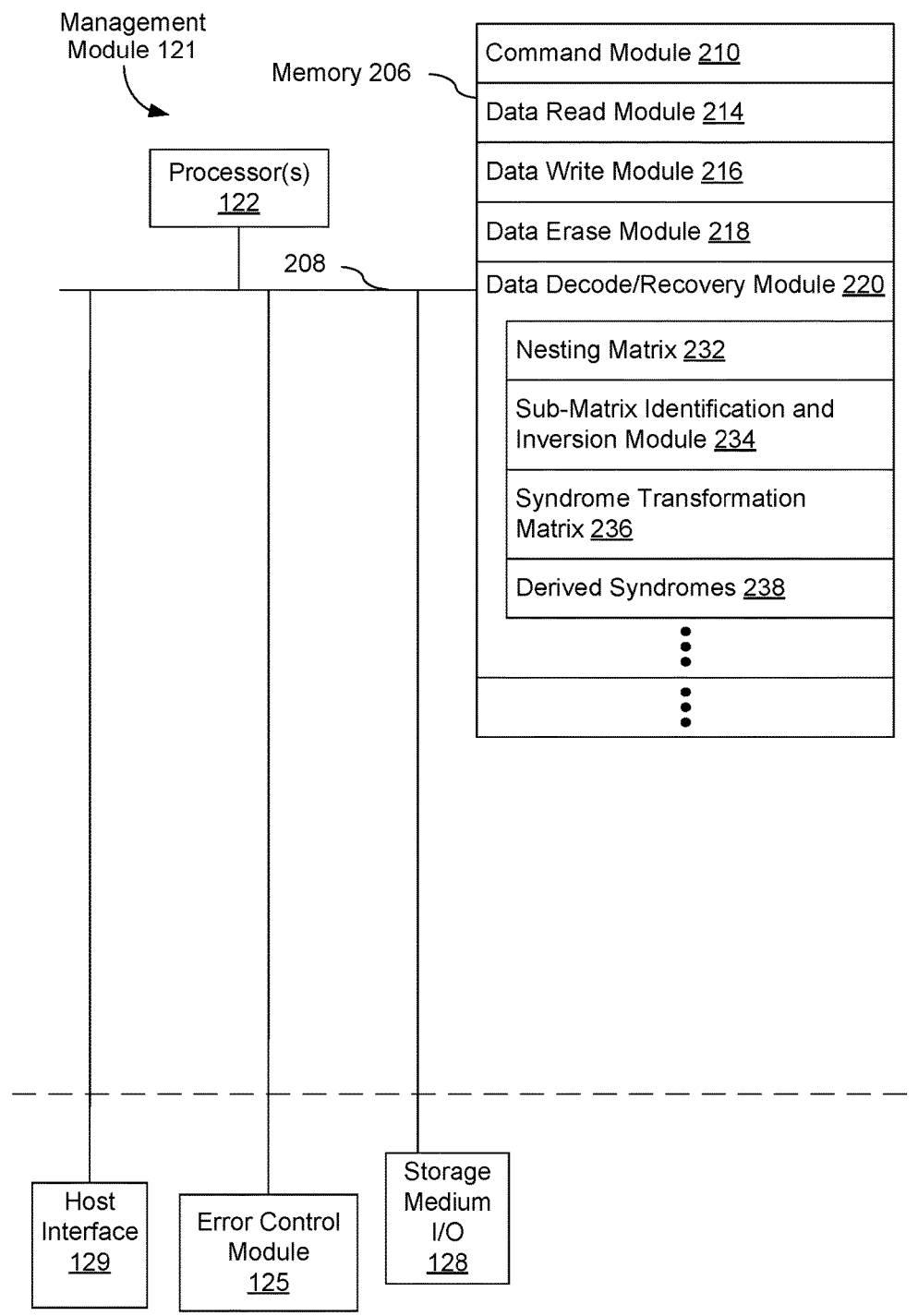
FIG. 2 is a block diagram of a management module in the storage controller of a storage device, in accordance with some embodiments.

FIG. 2 illustrates a block diagram of management module 121 in accordance with some embodiments. Management module 121 typically includes: one or more processors 122 (sometimes herein called CPUs, processing units, hardware processors, processors, microprocessors or microcontrollers) for executing modules, programs and/or instructions stored in memory 206 and thereby performing processing operations. Management module 121 also includes memory 206 (sometimes herein called controller memory), and one or more communication buses 208 for interconnecting these components. Communication buses 208 optionally include circuitry (sometimes called a chipset) that interconnects and controls communications between system components. Management module 121 is coupled by communication buses 208 to storage medium interface 128, error control module 125, and host interface 129. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the one or more processors 122. Memory 206, or alternatively the non-volatile memory device(s) within memory 206, comprises a non-transitory computer readable storage medium. In some embodiments, memory 206, or the non-transitory computer readable storage medium of memory 206, stores the following programs, modules, and data structures, or a subset or superset thereof:

1. command module (sometimes called an interface module) 210 for receiving or accessing a host command specifying an operation to be performed and a logical or physical address corresponding to a selectable portion 131 or storage medium 130 within the storage device 120 (FIG. 1);
2. data read module 214 for reading data from storage medium 130 (e.g., non-volatile memory);
3. data write module 216 for writing data to storage medium 130;
4. data erase module 218 for erasing data in storage medium 130;
5. data decoding or recovery module 220 for decoding or recovering a codeword for which decoding using first layer parity information for the codeword was unsuccessful (e.g., due to the presence of more errors than the correction power of the first layer codes used to encode the codeword); data decoding or recovery module 220 optionally includes:
    joint nesting matrix module 232 for specifying multiple layers of integrated interleaved codes, including first, second and third layers of integrated interleaved codes, to be used for encoding and decoding a set of codewords;
    submatrix identification and inversion module 234 for identifying and inverting a submatrix of joint nesting matrix 232;
    syndrome transformation matrix 236, produced by submatrix identification and inversion module 234; and
    derived codeword syndromes 238, sometimes called higher order syndromes, produced by inverting syndrome transformation matrix 236 and multiplying the nested syndromes for one or more subgroups of codewords by the inverted syndrome transformation matrix.

Further information regarding the modules and data structures listed above is provided in the following discussions. Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the non-transitory computer readable storage medium of memory 206, provide instructions for implementing any of the methods described below with reference to FIG. 5. Stated another way, the programs or modules stored in memory 206, when executed by the one or more processors 122, cause storage device 120 to perform any of the methods described below with reference to FIG. 5.

Although FIG. 2 shows a management module 121, FIG. 2 is intended more as functional description of the various features which may be present in a management module than as a structural schematic of the embodiments described herein. In practice, and as recognized by those of ordinary skill in the art, the programs, modules, and data structures shown separately could be combined and some programs, modules, and data structures could be separated.

Figure 3:
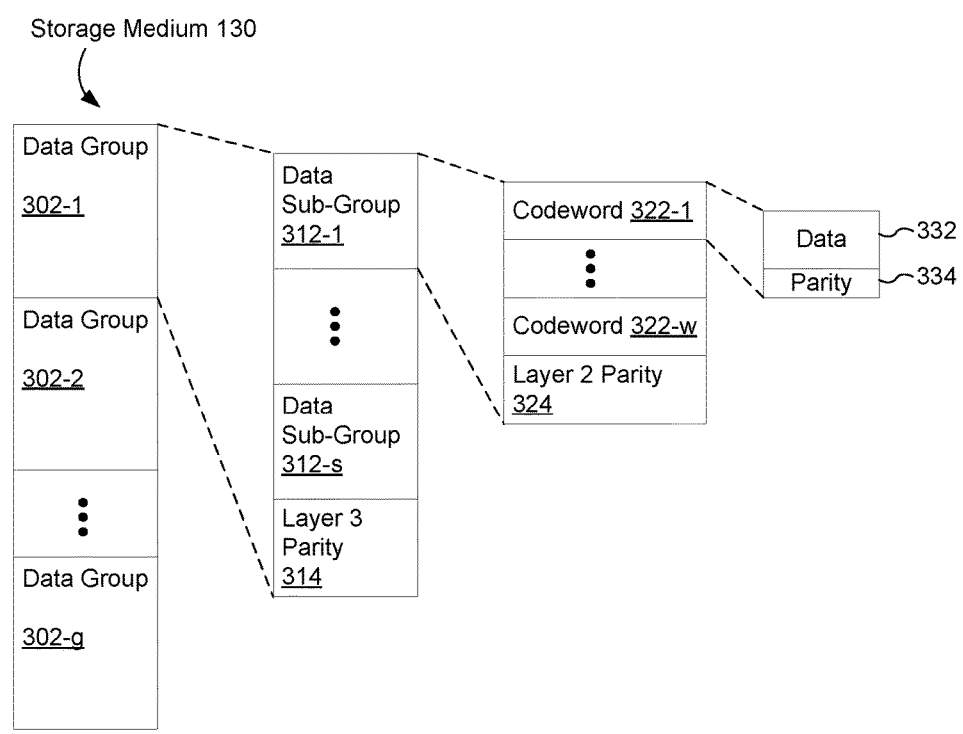
FIG. 3 is a block diagram schematically representing how groups of codewords, and their parity information, are stored, in accordance with some embodiments.

FIG. 3 is a block diagram schematically representing how groups 302 of codewords 322, and their parity information, are stored, in accordance with some embodiments. As shown, multiple groups 302 (e.g., groups 302-1, 302-2, . . . 303-g) of codewords are stored in storage medium 302. Each group 302 includes a plurality of subgroups 312 (e.g., subgroups 312-1 to 312-s) of codewords, as well as layer three parity information 314 for the group 302. Similarly, each subgroup 312 include a plurality of codewords 322 (e.g., codewords 322-1 to 322-w), as well as layer two parity information 324 for the subgroup 312. Finally, each codeword 322 includes data 332 and first layer parity information 334 for the codeword 322.

In some embodiments, each subgroup 312 of a group 302 is stored in a separate memory device, or memory channel, of storage medium 130. Stated another way, in such embodiments the codewords 322 and layer 2 parity information 324 in each subgroup 312 are stored in the same memory device or same memory channel. As a result, all the information required for decoding a subgroup of data is located (i.e., stored) in the same memory device or same memory channel of storage medium 130.

In some embodiments, all the codewords in a group 302 of codewords are stored in distinct memory devices or distinct memory channels of storage medium 130 to enable those codewords to be stored or written in parallel, and to be read in parallel. This storage scheme reduces access times when only the layer 1 parity information is required for successful reading or decoding of data, but increases accesses times relative to embodiments in which each subgroup of data is located in the same memory device or same memory channel of storage medium 130.

It is noted that, in various embodiments, parities are not necessarily stored separately from the corresponding codewords or sub-groups, and may be scatters among the codewords.

FIG. 4A schematically depicts a joint nesting matrix 232. Joint nesting matrix 322 has $m_1$ column blocks, each comprising a block of columns, where $m_1$ is the number of codeword subgroups in a group of codewords. In some embodiments, $m_1$ is equal to an integer between 2 and 8, inclusive, although values larger than 8 may be used in other embodiments. In FIG. 4A the column blocks are separated by vertical solid lines. As will be further described with reference to FIG. 4B, each column block has $m_2$ columns, where $m_2$ is the number of codewords in each subgroup of codewords, and $v_1$ is the number of codes, also called levels of codes, in the second layer of codes. In some embodiments, $v_1$ is equal to 1, 2 or 3, although values larger than 3 are possible. Furthermore, joint nesting matrix 232 has a first portion 402 (the upper portion) that has a first set of row blocks and a second portion 404 (the lower portion) that has a second set of row blocks.

The first portion 402 of joint nesting matrix 232 has non-zero elements only along a main diagonal of the joint nesting matrix. Each non-zero element of the main diagonal is a first nesting matrix, $G_1$, having $v_1$ rows and $m_2$ columns, where $v_1$ is a number of levels of integrated interleaved codes in the second layer of integrated interleaved codes specified by joint nesting matrix 232. A diagram of first nesting matrix, $G_1$, is shown in FIG. 4B.

The second portion 404 of joint nesting matrix 232 has r−1 row blocks, comprising blocks of rows, and $m_1$ column blocks, where r is a maximum number of subgroups having errors not correctable by the second layer of integrated interleaved codes that can be corrected using the third layer of integrated interleaved codes. In some embodiments, r is equal to 2, 3 or 4, although other values larger than 4 are possible. Each element of the second portion 404 of joint nesting matrix 232 is a submatrix, corresponding to one row block and one column block of the second portion 404, having $m_2$ columns and $s_i$ rows, where $s_i$ is a maximum number of codewords, in subgroup i of the $m_1$ subgroups, having errors not correctable by the second layer of integrated interleaved codes for subgroup i that can be corrected using the third layer of integrated interleaved codes.

Each submatrix in the second portion 404 of joint nesting matrix 232 is of the form $\alpha^j G_2^i$ where i ranges from r−1 to 0 and corresponds to the row block of the second portion in which the submatrix is located, j ranges from 0 to 1−r (where 1−r is a negative integer value) and corresponds to the column block in which the submatrix is located, and $G_2^i$ is a second nesting matrix of the form shown in FIG. 4C, having $m_2$ columns and $s_i$ rows.

FIG. 4D shows an example of a joint nesting matrix, where $v_1$, the number of codes, also called levels of codes, in the second layer of integrated interleaved codes, is equal to 1. Layer 3 parities enable the correction of extra interleaves from r=1 subgroup and the number of extra interleaves in that subgroup correctable by layer 3 parities is $s_0=1$.

Two-Layer GII Codes

To facilitate understanding of the three-layer GII codes introduced in this document, two-layer GII codes are explained first. The GII scheme works on a set of m codewords (sometimes called interleaves) of length n denoted by $c_0, c_1, \ldots, c_{m-1}$. Each codeword belongs to the first-layer code $C_0(n, k_0)$. First-layer codes are optionally implemented using Reed-Solomon codes over a finite field, GF(q). The second layer codes include v codes $C_i(n, k_i)$, for i=1 to v, where $0<i\le v<m$ such that $C_v \subseteq C_{v-1} \subseteq \ldots \subseteq C_0$. A two-layer GII code is defined as $$C = \left\{ c = [c_0, c_1, \ldots, c_{m-1}] : c_i \in C_0, \tilde{c}_j = \sum_{i=0}^{m-1} \alpha^{ij} c_i \in C_{v-j}, 0 \le j < v \right\}$$

where $\alpha$ is a primitive element of the finite field, GF(q). The nesting in the above definition is also expressed as $$\begin{bmatrix} \tilde{c}_0 \\ \tilde{c}_1 \\ \vdots \\ \tilde{c}_{v-1} \end{bmatrix} = \begin{bmatrix} 1 & 1 & 1 & \ldots & 1 \\ 1 & \alpha & \alpha^2 & \ldots & \alpha^{m-1} \\ \vdots & \vdots & \vdots & \ddots & \vdots \\ 1 & \alpha^{(v-1)} & \alpha^{2(v-1)} & \ldots & \alpha^{(v-1)(m-1)} \end{bmatrix} \begin{bmatrix} c_0 \\ c_1 \\ \vdots \\ c_{m-1} \end{bmatrix}. \quad (1)$$

In this document, a vector and its polynomial representation are used interchangeably. Let the received (corrupted) codewords be $y_i(x)=c_i(x)+e_i(x)$ ($0\le i<m$), where $e_i(x)$ is the error vector. $|e_i|$ denotes the hamming weight of $e_i(x)$. The error-correction capability of $C_i$ is $t_i=(n-k_i)/2$, and $t_0<t_1\le \ldots \le t_v$. Sort $|e_i|$ to $\tau_i$ such that $\tau_0 \le \tau_1 \le \ldots \le \tau_{m-1}$. The decoding will be successful if and only if $\tau_{m-1-v+i} \le t_i$ for i=0, 1, 2, ..., v.

2t valid syndromes are needed to correct t errors. In the decoding, if $|e_i|\le t_0$, then the errors are correctable within the codeword itself making use of $2t_0$ syndromes $S_j^{(i)}=e_i(\alpha^j)=y_i(\alpha^j)$ ($1\le j\le 2t_0$). Higher-order syndromes are not computable from $y_i(x)$, since $c_i \in C_0$ and hence $c_i(\alpha^j)\ne 0$ and $e_i(\alpha^j)\ne y_i(\alpha^j)$ for $j>2t_0$. Instead, if any interleave has $|e_i|>t_0$ errors, then the extra syndromes needed are obtained from the nested syndromes defined as $\tilde{S}_j^{(i)}=\tilde{y}_i(\alpha^j)$, where $\tilde{y}_i(x)=\sum_{j=0}^{m-1}\alpha^{ij}y_j(x)$. Since $\tilde{c}_i(x)=\sum_{j=0}^{m-1}\alpha^{ij}c_j(x) \in C_1$ for $0<i<v$, $\tilde{c}_i(\alpha^j)=0$ for $2t_0+1\le j\le 2t_1$. As a result, let the indices of the $b\le v$ failed codewords (i.e., codewords not successfully decoded using the first layer codes) be $l_1, l_2, \ldots, l_b$, their $2(t_1-t_0)$ higher-order syndromes can be derived through $$[S_j^{(l_1)}, S_j^{(l_2)}, \ldots, S_j^{(l_b)}]^T = A^{-1}[\tilde{S}_j^{(0)}, \tilde{S}_j^{(1)}, \ldots, \tilde{S}_j^{(b-1)}]^T, \quad (2)$$

where A is the b×b submatrix formed by the first b rows and columns $l_1, l_2, \ldots, l_b$ in the nesting matrix of equation (1). Matrix A in equation (2) is sometimes called the syndrome transformation matrix. After the codewords with at most $t_1$ errors are corrected, the nested syndromes are updated. Then the $2t_2-2t_1$ higher syndromes for the remaining uncorrected codewords are derived using an equation similar to equation (2). This process is repeated to derive higher-order syndromes for the codewords with more errors.

Three-Layer GII Codes

In this document, codewords that have more than $t_0$ errors are called exceptional codewords or exceptional interleaves. In the 2-layer GII scheme explained above, all codewords need to be accessed if any of them is exceptional. Reading and transferring more symbols cause longer latency and larger network traffic overhead in a distributed system. One effective way to improve the locality is to group the codewords and apply the nesting in multiple layers. When there are fewer extra errors to be corrected, the nestings in lower layers involving fewer codewords are utilized.

Next, we analyze the conditions that need to be satisfied in order to utilize the parities in the nested layers to correct extra errors in codewords, where "extra errors" are errors in excess of the correction capability of the first layer codes. Then a generalized three-layer GII scheme, in which v>1 (i.e., more than one level of codes) is allowed in both layers and the layer-three parities can be used to correct more codewords than those that can be corrected by a layer-two nesting, is described.

As shown in equation (1), a nesting scheme is defined by a matrix. To correct extra errors in a set of codewords, additional syndromes are acquired through transforming the nested syndromes, such as using equation (2) for the two-layer case. Since the syndrome transformation matrix A in equation (2) is a Vandermonde matrix, regardless of which codewords in a group of codewords are exceptional, and hence regardless of which columns of the nesting matrix in equation (1) are selected for inclusion in a submatrix of the joint nexting matrix, the submatrix is always non-singular. Therefore, "extra" codeword syndromes, sometimes herein called derived codeword syndromes, can be always derived from the nested syndromes if $\tau_{m-1-v+i} \leq t_i$ for $0 \leq i \leq v$.

In the following explanation, a three-layer nesting is provided for m codewords divided into $m_1$ subgroups of $m_2$ codewords (i.e., the group of codewords includes $m_1$ subgroups, and each subgroup has $m_2$ codewords). In the three-layer nesting, the same nesting, defined by matrix $G_1$, is applied to each subgroup in layer two. The three-layer nesting matrix $\Gamma$ (232) has an upper part (402), which is an $m_1$ diagonal of the $v_1 \times m_2$ matrix $G_1$, and has a lower part (404), $G_2$, that is an $r \times m_1$ array of $s_i \times m_2$ submatrix blocks $G_2^i$. The parameterized joint nesting matrix $\Gamma$ implements v1-level correction in the second layer, composed of $m_1$ subblocks with $m_2$ codewords in each. At the third layer, the parameterized joint nesting matrix $\Gamma$ is designed to recover up to $s_i$ erasures within the $i^{th}$ subblock, in at most r subblocks that are uncorrectable using the second layer of joint nesting matrix $\Gamma$.

The syndromes from the $G_1$ nesting can be used to correct exceptional interleaves in the same subgroup according to a similar method as in the two-layer GII scheme. If the errors exceed the correction capability of a subgroup (i.e., using the second layer parity information for the subgroup), the syndromes from the $G_2$ nesting are utilized (i.e., using the third layer parity information for the group of codewords). The nested syndromes from the second layer are denoted by $\tilde{S}_j^{(i)}(0 \leq i < m_1 v_1)$, and those from the third layer are denoted by $\tilde{S}_j^{(i)}(0 \leq i < v_2)$. In equation (3), shown below, the superscript (p,q) is used to represent the column vector formed by the syndromes whose (i) are in the range of [p, p+q-1]. For example, $S_j^{(3,5)} = [S_j^{(3)}, \ldots, S_j^{(7)}]^T$. The codeword syndromes (often called interleave syndromes) are connected to the nested syndromes through the joint nesting matrix, as shown in equation (3):

$$\begin{bmatrix} G_1 & 0 & \cdots & 0 \\ 0 & G_1 & \cdots & 0 \\ \vdots & \vdots & \ddots & \vdots \\ 0 & 0 & \cdots & G_1 \\ \hline & & G_2 & \end{bmatrix} \begin{bmatrix} S_j^{(0,m_2)} \\ S_j^{(m_2,m_2)} \\ \vdots \\ S_j^{(m-m_2,m_2)} \end{bmatrix} = \begin{bmatrix} \tilde{S}_j^{(0,v_1)} \\ \tilde{S}_j^{(v_1,v_1)} \\ \vdots \\ \tilde{S}_j^{((m_1-1)v_1,v_1)} \\ \tilde{S}_j^{(0,v_2)} \end{bmatrix}. \quad (3)$$

The first matrix in equation (3) is referred to as the joint nesting matrix $\Gamma$. When there are exceptional codewords (also called exceptional interleaves), which are codewords having errors beyond the correction capability of the $G_1$ nesting, the storage controller (e.g., data decode/recovery module 220, FIG. 2) picks the columns in the joint nesting matrix $\Gamma$ corresponding to all exceptional codewords, and forms a square submatrix $A_3$ from elements of the joint nesting matrix $\Gamma$ in those columns. The construction of the joint nesting matrix $\Gamma$ guarantees that submatrix $A_3$ is invertible. Submatrix $A_3$ serves essentially the same purpose as syndrome transform matrix A in equation (2), and is also called a syndrome transform matrix, but is configured for transforming nested syndromes from both the second layer and third layer into derived codeword syndromes for decoding the exceptional codewords in a group of codewords. The inversion of submatrix $A_3$, denoted $A_3^{-1}$, is then applied to a nested syndrome vector containing (A) a subset of the nested syndromes from the second layer corresponding to the columns (i.e., column blocks) in the joint nesting matrix corresponding to the subgroups that have exceptional codewords, and (B) a corresponding subset of the nested syndromes from the third layer, which together comprise a subset of the vector on the right side of equation (3). The product produced by the application of $A_3^{-1}$ to the nested syndrome vector are derived codeword syndromes for decoding the exceptional codewords. It is noted that each of the derived codeword syndromes is based in part on the nested syndromes from the third layer, and in part from the nested syndromes from the second layer, thereby making use of all the available correction capability of the second layer and third layer codes.

Data Decoding Method

Figure 5:
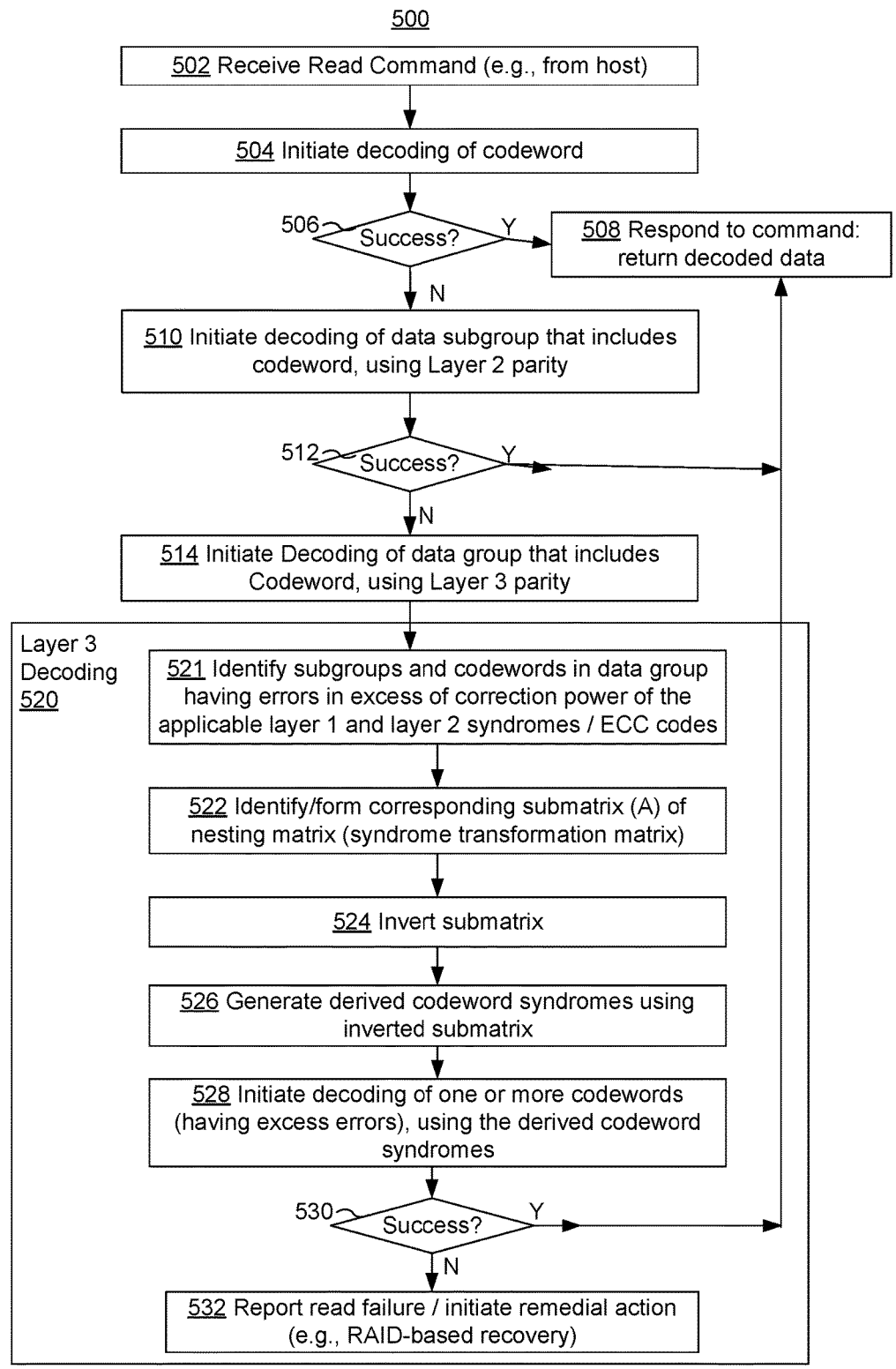
FIG. 5 is a flowchart of a method of reading data, including decoding data using three-layer generalized integrated interleaved codes, in accordance with some embodiments.

FIG. 5 depicts a flowchart of a method 500 of operating a data storage device, and in particular or responding to a read command received from a host device when the requested codeword contains too many errors to be successfully decoded using the layer 1 and layer 2 parity information for the requested codeword and a subgroup of codewords that includes the requested codeword. Method 500 is typically performed by the storage controller 124 or management module 121 of a storage device 120 or storage system, for example under the control of a data decode/recovery module 220 (FIG. 2), but alternatively may be performed by a computer system (e.g., computer system 110) in which a storage device is embedded.

A read command is received (502) from a computer system, sometimes herein called a host or host system, such as computer system 110 (FIG. 1). The read command specifies data to be read from storage medium 130, such as by specifying a logical or physical address. In response to the read command, decoding of a respective codeword is initiated (504), where the respective codeword corresponds to the data specified by the read command to be read. For ease of reference, the respective codeword is herein called a first codeword. It is noted that the first codeword is included in a first subgroup of codewords, which in turn is included in a group of codewords, sometimes herein called a set of codewords. As described above, the group of codewords is stored in storage medium 130 with first, second and third layers of parity information.

The initiated decoding (504) of the first codeword uses first layer parity information for the first codeword. If that decoding is successful (506-Y), producing decoded data for the first codeword, a response to the read command is provided (508), returning the decoded data.

If the initiated decoding (504) of the first codeword is unsuccessful (506-N), because the first codeword contains more errors than the error correction capability of the first layer integrated interleaved codes, method 500 initiates decoding (510) of a data subgroup (sometimes herein called the first subgroup) that includes the first codeword, using layer 2 parity information for the subgroup. If that decoding is successful (512-Y), producing decoded data for the first codeword and optionally producing decoded data for the other codewords in the subgroup, a response to the read command is provided (508), returning the decoded data for the first codeword.

If the initiated decoding (514) of the first codeword is unsuccessful (512-N), because one or more of the codewords in the first subgroup contains more errors than the error correction capability of the second layer integrated interleaved codes, method 500 initiates decoding (520) of a data group (sometimes herein called the first group) that includes the first codeword and the first subgroup, using layer 3 parity information for the group. The third level of decoding includes identifying (521) subgroups and codewords in the data group having errors in excess of the correction capability of the applicable first layer and second layer integrated interleaved codes. For example, the identified subgroups will include the first subgroup, and may also include one or more other subgroups of the data group. For purposes of this explanation, it is assumed that the joint nesting matrix is configured to enable correction of excess errors in two or more subgroups of the data group, and that excess errors have in fact been detected in two or more subgroups of the data group. Of course, should excess errors occur in just one subgroup, the excess errors in the one subgroup can be corrected, since the error correction capability of the joint nesting matrix in that case would be greater than what is needed to correct those excess errors.

Based on the codewords in the one or more identified subgroups, identified as having excess errors, a corresponding submatrix of the joint nesting matrix is identified or formed (522), and then inverted (524). The identified submatrix is sometimes called a syndrome transform matrix, and the inverted submatrix is sometimes called the inverted syndrome transform matrix. Formation of the submatrix and its inversion to generate a syndrome transform matrix are discussed above. When the number of identified subgroups is equal to two, the submatrix is identified from the two column blocks of the join nesting matrix corresponding to those two blocks. Similarly, when the number of identified subgroups is equal to one (e.g., the number of subblocks with excess errors is less than the error correction capability of the third layer), the submatrix is identified from the single column block of the join nesting matrix corresponding to the identified subgroup.

Using the inverted syndrome transform matrix, derived codeword syndromes are generated (526) by multiplying the inverted syndrome transform matrix (e.g., using matrix multiplication) with the syndromes (e.g., second layer and third layer nested syndromes) corresponding to the identified one or more subgroups of codewords.

Once the derived codeword syndromes have been generated, decoding of one or more codewords, including the first codeword, using the derived codeword syndromes is initiated (528). If the initiated decoding (528) of the one or more codewords using the derived codeword syndromes is successful (530-Y), the decoding produces decoded data for the first codeword and optionally decoded data for the other codewords in the group, and method 500 includes providing a response to the read command (508), returning the decoded data for the first codeword. However, if the initiated decoding (528) is unsuccessful (530-N), because one or more of the identified codewords more errors than the error correction capability of third layer integrated interleaved codes, a read failure is reported (532), or alternatively, a remedial action is initiated, for example by initiating a RAID-based failure recovery mechanism.

In some embodiments, at least two codewords in a subgroup having excess errors, not correctable using the first layer parity information, are correctable using the third layer parity information (or, equivalently, the third layer nested syndromes).

In some embodiments, the first layer of integrated interleaved codes are for correcting errors in individual codewords in the set of codewords, the second layer of integrated interleaved codes are for correcting errors in subgroups of codewords in the set of codewords that are not correctable by the first layer of integrated interleaved codes, each subgroup of codewords having $m_2$ codewords, and the third layer of integrated interleaved codes are for correcting errors in one or more subgroups of the codewords in the set of codewords having at least one codeword not correctable using the first and second layers of integrated interleaved codes, each group having $m_1$ subgroups, where m1 is an integer greater than 1 and $m_2$ is an integer greater than 1. In such embodiments, the joint nesting matrix has $m_1$ column blocks, comprising blocks of columns, each column block having $m_2$ columns, and furthermore the joint nesting matrix has a first portion that has a first set of rows and a second portion that has a second set of rows. The first portion of the joint nesting matrix has non-zero elements only along a main diagonal of the joint nesting matrix, each non-zero element of the main diagonal comprising a first nesting matrix, $G_1$, having $v_1$ rows and $m_2$ columns, where $v_1$ is a number of levels of integrated interleaved codes in the second layer of integrated interleaved codes.

The second portion of the joint nesting matrix has r−1 row blocks, comprising blocks of rows, and $m_1$ column blocks, where r is a maximum number of subgroups having errors not correctable by the second layer of integrated interleaved codes that can be corrected using the third layer of integrated interleaved codes, each element of the second portion comprising a submatrix, corresponding to one row block and one column block of the second portion, having $m_2$ columns and $s_i$ rows, where $s_i$ is a maximum number of codewords, in subgroup i of the $m_1$ subgroups, having errors not correctable by the second layer of integrated interleaved codes for subgroup i that can be corrected using the third layer of integrated interleaved codes.

In some embodiments, r, the maximum number of subgroups having errors not correctable by the second layer of integrated interleaved codes that can be corrected using the third layer of integrated interleaved codes, is equal to one or more.

In some embodiments, $s_i$, for at least one subgroup i of the $m_1$ subgroups, is equal to one or more.

In some embodiments, each submatrix in the second portion of the joint nesting matrix is of the form $\alpha^j G_2^i$ where i ranges from r−1 to 0 and corresponds to the row block of the second portion in which the submatrix is located, j ranges from 0 to 1−r and corresponds to the column block in which the submatrix is located, and $G_2^i$ is a nesting matrix of the form shown in FIG. 4C, having m2 columns and $s_i$ rows.

In some embodiments, the memory storing the set of codewords comprises one or more flash memory devices. In some embodiments, the set of codewords includes N codewords, stored in N distinct memory devices, where N is an integer having a value of 4 or more.

For some embodiments, FIG. 4D shows an example of a joint nesting matrix where r, the maximum number of subgroups having excess errors, not correctable using the second layer parities, that can be correcting using the third later of integrated interleaved codes is equal to 1; $v_1$, the number of codes, also called levels of integrated interleaved codes, in the second layer of integrated interleaved codes, is equal to 1, and $s_i$ is equal to 1, indicating that third layer can be used to correct one additional codeword in at least one subgroup, beyond the number of codewords correctable using the second layer parities.

For some embodiments, FIG. 4D shows an example of a joint nesting matrix for a group of codewords having two subgroups, each having two codewords, and an "additional" error correction capability in the third layer of an additional codeword in at least one subgroup. In this example, r, the maximum number of subgroups having excess errors, not correctable using the second layer parities, that can be correcting using the third later of integrated interleaved codes is equal to 1, and $s_i$ is equal to 1, indicating that third layer can be used to correct one additional codeword in at least one subgroup, beyond the number of codewords correctable using the second layer parities. As a result, a system that encodes data in accordance with this joint nesting matrix will be able to correct excess errors in one or more codewords, not correctable using the first layer codes, using the second and third layer codes in the situations shown in Table 1, where each "pattern" {a,b|c,d} indicates the number of excess errors in first, second, third and fourth codewords of a group of four codewords, where the first and second codewords are in a first subgroup and the third and fourth codewords are in a second subgroup, and a, b, c and d represent the numbers of excess errors in the first, second, third and fourth codewords, respectively.

TABLE 1

Correctable extra error patterns

| Pattern | GII | Pattern | GII |
|---------|-----|---------|-----|
| {1, 0 \| 0, 0} | yes | {1, 0 \| 1, 0} | yes |
| {1, 1 \| 0, 0} | yes | {1, 1 \| 1, 0} | yes |
| {2, 0 \| 0, 0} | yes | {2, 0 \| 1, 0} | yes |
| {2, 1 \| 0, 0} | yes | {2, 1 \| 1, 0} | yes |

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

The invention claimed is:

1. A data storage system, comprising:
   memory storing a set of codewords, wherein the set of codewords are encoded in accordance with a joint nesting matrix specifying multiple layers of integrated interleaved codes, including first, second and third layers of integrated interleaved codes, and the set of codewords stored in the memory include first, second and third layers of parity information corresponding to the first, second and third layers of integrated interleaved codes;
   a host interface configured to receive memory access command from a host system;
   a controller coupled to the host interface and the memory, the controller configured to:
      receive the memory access commands, including data read commands and data write commands, from the host system, and in response to a first data read command specifying data to be read, control a process of accessing and decoding the specified data so as to produce decoded data, the specified data including a first codeword, including:
         initiating decoding of the first codeword using the first layer parity information for the first codeword;
         in accordance with a determination that the decoding of the first codeword using the first layer of parity information is unsuccessful, initiating decoding of a first subgroup of codewords that include the first codeword using the second layer parity information for the first subgroup of codewords;
         in accordance with a determination that the decoding of the first subgroup of codewords using the second layer of parity information for the first subgroup is unsuccessful, initiating decoding of a group of codewords that include a plurality of subgroups of codewords, including the first subgroup of codewords, using the third layer parity information for the group of codewords, including:
            identifying, in the group of codewords, one or more subgroups of codewords in the group of codewords that each include at least one codeword not correctable using the first layer parity information for the at least one codeword and the second layer parity information for the identified subgroups of codewords, wherein the identified one or more subgroups include the first subgroup;
            forming a syndrome transformation matrix, comprising an invertible submatrix of the joint nesting matrix, corresponding to the identified one or more subgroups of codewords;
            inverting the syndrome transformation matrix;
            generating a set of derived codeword syndromes by multiplying nested syndromes corresponding to the identified one or more subgroups of codewords by the inverted syndrome transform matrix; and decoding one or more codewords, including the first codeword, using the derived codeword syndromes.

2. The data storage system of claim 1, wherein the first subgroup includes at least two codewords not correctable using the first layer parity information for the at least two codewords.

3. The data storage system of claim 1, wherein:

the first layer of integrated interleaved codes are for correcting errors in individual codewords in the set of codewords, the second layer of integrated interleaved codes are for correcting errors in subgroups of codewords in the set of codewords that are not correctable by the first layer of integrated interleaved codes, each subgroup of codewords having $m_2$ codewords, and the third layer of integrated interleaved codes are for correcting errors in subgroups of the codewords having at least one codeword not correctable using the first and second layers of integrated interleaved codes, each group having $m_1$ subgroups, where $m_1$ is an integer greater than 1 and $m_2$ is an integer greater than 1; and the joint nesting matrix has $m_1$ column blocks, comprising blocks of columns, each column block having $m_2$ columns, and furthermore having a first portion that has a first set of rows and a second portion that has a second set of rows, the first portion having non-zero elements only along a main diagonal of the joint nesting matrix, each non-zero element of the main diagonal comprising a first nesting matrix, $G_1$, having $v_1$ rows and $m_2$ columns, where $v_1$ is a number of levels of integrated interleaved codes in the second layer of integrated interleaved codes, and the second portion having r−1 row blocks, comprising blocks of rows, and $m_1$ column blocks, where r is a maximum number of subgroups having errors not correctable by the second layer of integrated interleaved codes that can be corrected using the third layer of integrated interleaved codes, each element of the second portion comprising a submatrix, corresponding to one row block and one column block of the second portion, having $m_2$ columns and $s_i$ rows, where $s_i$ is a maximum number of codewords, in subgroup i of the $m_1$ subgroups, having errors not correctable by the second layer of integrated interleaved codes for subgroup i that can be corrected using the third layer of integrated interleaved codes.

4. The data storage system of claim 3, wherein r is equal to one or more.

5. The data storage system of claim 4, wherein $s_i$, for at least one subgroup i of the $m_1$ subgroups, is equal to one or more.

6. The data storage system of claim 3, wherein each submatrix in the second portion of the joint nesting matrix is of the form $\alpha^j G_2^i$ where i ranges from r−1 to 0 and corresponds to the row block of the second portion in which the submatrix is located, j ranges from 0 to 1−r and corresponds to the column block in which the submatrix is located, and $G_2^i$ comprises a nesting matrix having $m_2$ columns and $s_i$ rows.

7. The data storage system of claim 1, wherein the memory storing the set of codewords comprises one or more flash memory devices.

8. The data storage system of claim 1, wherein the set of codewords includes N codewords, stored in N distinct memory devices, where N is an integer having a value of 4 or more.

9. A method of operating a data storage system, comprising:

storing a set of codewords in memory located within the data storage system, wherein the set of codewords are encoded in accordance with a joint nesting matrix specifying multiple layers of integrated interleaved codes, including first, second and third layers of integrated interleaved codes, and the set of codewords stored in the memory include first, second and third layers of parity information corresponding to the first, second and third layers of integrated interleaved codes;

receiving a first data read command specifying data to be read from the memory;

in response to the first data read command, performing a sequence of operations, including:

initiating decoding of the first codeword using the first layer parity information for the first codeword;

in accordance with a determination that the decoding of the first codeword using the first layer of parity information is unsuccessful, initiating decoding of a first subgroup of codewords that include the first codeword using the second layer parity information for the first subgroup of codewords;

in accordance with a determination that the decoding of the first subgroup of codewords using the second layer of parity information for the first subgroup is unsuccessful, initiating decoding of a group of codewords that include a plurality of subgroups of codewords, including the first subgroup of codewords, using the third layer parity information for the group of codewords, including:

identifying, in the group of codewords, one or more subgroups of codewords in the group of codewords that each include at least one codeword not correctable using the first layer parity information for the at least one codeword and the second layer parity information for the identified subgroups of codewords, wherein the identified one or more subgroups include the first subgroup;

forming a syndrome transformation matrix, comprising an invertible submatrix of the joint nesting matrix, corresponding to the identified one or more subgroups of codewords;

inverting the syndrome transformation matrix;

generating a set of derived codeword syndromes by multiplying nested syndromes corresponding to the identified one or more subgroups of codewords by the inverted syndrome transform matrix; and decoding one or more codewords, including the first codeword, using the derived codeword syndromes.

10. The method of claim 9, wherein the first subgroup includes at least two codewords not correctable using the first layer parity information for the at least two codewords.

11. The method of claim 9, wherein:

the first layer of integrated interleaved codes are for correcting errors in individual codewords in the set of codewords, the second layer of integrated interleaved codes are for correcting errors in subgroups of codewords in the set of codewords that are not correctable by the first layer of integrated interleaved codes, each subgroup of codewords having $m_2$ codewords, and the third layer of integrated interleaved codes are for correcting errors in subgroups of the codewords having at least one codeword not correctable using the first and second layers of integrated interleaved codes, each group having $m_1$ subgroups, where $m_1$ is an integer greater than 1 and $m_2$ is an integer greater than 1; and
the joint nesting matrix has $m_1$ column blocks, comprising blocks of columns, each column block having $m_2$ columns, and furthermore having a first portion that has a first set of rows and a second portion that has a second set of rows,
the first portion having non-zero elements only along a main diagonal of the joint nesting matrix, each non-zero element of the main diagonal comprising a first nesting matrix, $G_1$, having $v_1$ rows and $m_2$ columns, where $v_1$ is a number of levels of integrated interleaved codes in the second layer of integrated interleaved codes, and
the second portion having r−1 row blocks, comprising blocks of rows, and $m_1$ column blocks, where r is a maximum number of subgroups having errors not correctable by the second layer of integrated interleaved codes that can be corrected using the third layer of integrated interleaved codes, each element of the second portion comprising a submatrix, corresponding to one row block and one column block of the second portion, having $m_2$ columns and $s_i$ rows, where $s_i$ is a maximum number of codewords, in subgroup i of the $m_1$ subgroups, having errors not correctable by the second layer of integrated interleaved codes for subgroup i that can be corrected using the third layer of integrated interleaved codes.

12. The method of claim 11, wherein r is equal to one or more.

13. The method of claim 12, wherein $s_i$, for at least one subgroup i of the $m_1$ subgroups, is equal to one or more.

14. The method of claim 11, wherein each submatrix in the second portion of the joint nesting matrix is of the form $\alpha^j G_2^i$ where i ranges from r−1 to 0 and corresponds to the row block of the second portion in which the submatrix is located, j ranges from 0 to 1−r and corresponds to the column block in which the submatrix is located, and $G_2^i$ comprises a nesting matrix having $m_2$ columns and $s_i$ rows.

15. The method of claim 9, wherein the memory storing the set of codewords comprises one or more flash memory devices.

16. The method of claim 9, wherein the set of codewords includes N codewords, stored in N distinct memory devices, where N is an integer having a value of 4 or more.

17. A non-transitory computer readable storage medium storing one or more programs that, when executed by one or more processors of a data storage system, cause the data storage system to perform operations, comprising:
storing a set of codewords in memory located within the data storage system, wherein the set of codewords are encoded in accordance with a joint nesting matrix specifying multiple layers of integrated interleaved codes, including first, second and third layers of integrated interleaved codes, and the set of codewords stored in the memory include first, second and third layers of parity information corresponding to the first, second and third layers of integrated interleaved codes;
receiving a first data read command specifying data to be read from the memory;
in response to the first data read command, performing a sequence of operations, including:
initiating decoding of the first codeword using the first layer parity information for the first codeword;
in accordance with a determination that the decoding of the first codeword using the first layer of parity information is unsuccessful, initiating decoding of a first subgroup of codewords that include the first codeword using the second layer parity information for the first subgroup of codewords;
in accordance with a determination that the decoding of the first subgroup of codewords using the second layer of parity information for the first subgroup is unsuccessful, initiating decoding of a group of codewords that include a plurality of subgroups of codewords, including the first subgroup of codewords, using the third layer parity information for the group of codewords, including:
identifying, in the group of codewords, one or more subgroups of codewords in the group of codewords that each include at least one codeword not correctable using the first layer parity information for the at least one codeword and the second layer parity information for the identified subgroups of codewords, wherein the identified one or more subgroups include the first subgroup;
forming an invertible submatrix of the joint nesting matrix, corresponding to the identified one or more subgroups of codewords;
inverting the invertible submatrix to form a syndrome transform matrix;
generating a set of derived codeword syndromes by multiplying nested syndromes corresponding to the identified one or more subgroups of codewords by the syndrome transform matrix; and
decoding one or more codewords, including the first codeword, using the derived codeword syndromes.

18. The non-transitory computer readable storage medium of claim 17, wherein the first subgroup includes at least two codewords not correctable using the first layer parity information for the at least two codewords.

19. The non-transitory computer readable storage medium of claim 17, wherein the memory storing the set of codewords comprises one or more flash memory devices.

20. The non-transitory computer readable storage medium of claim 17, wherein the set of codewords includes N codewords, stored in N distinct memory devices, where N is an integer having a value of 4 or more.

* * * * *